United States Patent [19]
Rumpf et al.
[11] Patent Number: 4,841,451
[45] Date of Patent: Jun. 20, 1989

[54] SYSTEM FOR MEASURING THE DURATION RATIO OF PULSES OF VARIABLE FREQUENCY

[75] Inventors: Bernd Rumpf, Friedrichsdorf; Wolfgang Reisch, Frankfurt am Main, both of Fed. Rep. of Germany

[73] Assignee: VDO Adolf Schindling AG, Frankfurt am Main, Fed. Rep. of Germany

[21] Appl. No.: 35,556

[22] Filed: Apr. 7, 1987

[30] Foreign Application Priority Data

Apr. 7, 1986 [DE] Fed. Rep. of Germany ....... 3611565

[51] Int. Cl.[4] ......................... G01R 29/02; H03K 5/26

[52] U.S. Cl. .................................... 364/484; 364/486; 324/78 Q; 328/136

[58] Field of Search ............... 364/484, 486, 489, 480, 364/481; 328/136; 123/357; 324/78 R, 78 Q

[56] References Cited

U.S. PATENT DOCUMENTS 4,476,832 10/1984 Fujimori et al. .................... 123/357
4,600,994 7/1986 Hayashi .............................. 328/133

*Primary Examiner*—Bruce Y. Arnold
*Assistant Examiner*—Terry S. Callaghan
*Attorney, Agent, or Firm*—Martin A. Farber

[57] ABSTRACT

In a system for measuring the duration ratio of pulses of variable frequency, particularly in electronically controlled fuel-injection systems for internal-combustion engines, there are derived clock pulses to the frequency of which a predetermined multiple of the frequency of the pulses (input pulses) corresponds. The duration ratio is then determined by counting the clock pulses during each one pulse. For duration ratios of 0% and 100%, corresponding values are delivered independently of the counting.

15 Claims, 4 Drawing Sheets

SYSTEM FOR MEASURING THE DURATION RATIO OF PULSES OF VARIABLE FREQUENCY

FIELD AND BACKGROUND OF THE INVENTION

The invention refers to a system for measuring the duration ratio of pulses of variable frequency, particularly in electronically controlled fuel-injection systems for internal combustion engines.

For the measuring of the duration ratio (pulse width-/period), particularly in electronically controlled fuel-injection systems for internal combustion engines, methods have become known in which two separate counters are used. The period is determined by the first counter while the pulse width is measured with the second counter. The ratio of the results of the two measurements is then formed by an arithmetic operation.

When this method is used it is necessary to establish the resolution of the result in advance as a function of the input frequency. In particular, if the frequency of the pulse to be measured is subject to large variations, then in view of low frequencies, a design of the period counter with a very high capacitance is necessary so that no overrun takes place if one still wishes to obtain a resolution which is still satisfactory at high frequencies.

SUMMARY OF THE INVENTION

It is an object of the invention to provide a system for measuring the duration ratio of pulses of variable frequency in which a measurement having a required resolution can be effected within a broad frequency range at the smallest technical expense possible.

According to the invention, clock pulses to the frequency of which a predetermined multiple of the frequency of the pulse (input pulse) corresponds are derived and the duration ratio is determined by counting the clock pulses during each pulse.

The system of the invention has the advantage that the duration ratio can be measured with the same resolution within a broad frequency range, counters and other digital circuits being designed only for a number of places which is needed for the required resolution.

In accordance with a first additional development of the invention, the frequency of the clock pulses can be obtained by measuring the period of the pulses, forming the reciprocal of the result of the measurement, and then multiplying it by a constant which corresponds to the multiple.

A second development of the invention consists in the fact that for the obtaining of the clock pulses a controllable oscillator, a frequency and phase comparison circuit, and a frequency divider are provided. In this way, for example, the use of commercial assemblies, in particular a PLL circuit (phase-locked loop), is made possible.

One advantageous development of the invention resides in the fact that the clock pulses are fed to a first input and the input pulses to a second input of an AND gate (7, 31) and that a counter (9, 32) is connected to the output of the AND gate (7, 31).

Further according to the invention, the counter (9, 32) can be reset with pulses which are derived by delay from the input pulses.

Also according to the invention, the counter (32) can be set to a predetermined value by signals fed over a first OR gate (41).

Also according to the invention, there is connected to the output of the counter (32) a D-register (33) which is clocked with pulses which are derived from the input pulses and fed to the D-register via a second OR gate (35). In particular the D-register makes it possible for a measurement value to be available for the entire period of the pulses to be measured.

In certain uses of the system of the invention, particularly upon use in electronically controlled injection systems, it may happen that the duration ratio becomes either 0% or 100%. With a duration ratio of 0% no pulses occur but merely a constant voltage with an "0" level, and with a duration ratio of 100%, there is a constant voltage with a "1" level. In neither case can a period or pulse frequency be noted.

Further according to the invention, means are provided for determining whether a duration ratio of 100% is present and for delivering a preestablished value in the case of a duration ratio of 100%.

For this various embodiments are possible. One can proceed from the basis that, in particular, circuits according to said further developments serve to determine a duration ratio of 100%, and that with a duration ratio of 0% the counter in any event remains at 0 due to the absence of input pulses.

According to one embodiment, such means for determining whether a duration ratio of 100% is present are connected to an input of the first OR gate (41) and, via a monostable multivibrator, to an input of the second OR gate (35).

Further, according to the invention, the means for determining whether a duration ratio of 100% is present comprise a comparator (38) to which, on the one hand, the output voltage of a frequency and phase comparison circuit (26) is fed and, on the other hand, a comparison voltage is fed.

Also according to the invention, the means for determining whether a duration ratio of 100% is present comprise a counter (52) having a carry output which can be reset by the input pulses, the clock input of the counter (52) is connected to the output of an OR gate (54), one input of the OR gate (54) is acted on by counter pulses, and the other input of the OR gate (54) is connected to the carry output.

Another development of the invention, consists in the fact that the pulse width is determined independently of the pulse frequency and that when a limit value is exceeded a duration ratio of 100% is assumed and that the limit value is derived from the pulse width of a preceding pulse.

This development permits a determination of whether a duration ratio of 100% is present, even with strongly varying frequencies and pulse widths, it being, however, assumed that these variations are subject to a certain inertia. These prerequisites are, however, present in the intended applications of the system of the invention developed further in this way.

According to the invention, the derivation is effected by addition/subtraction of a preestablished value. Also the derivation is effected by multiplication by a preestablished value.

BRIEF DESCRIPTION OF THE DRAWINGS

With the above and other objects and advantages in view, the present invention will become more clearly understood in connection with the detailed description of preferred embodiments, when considered with the accompany drawings, of which.

DETAILED DESCRIPTION OF THE PREFERRED EMBODIMENTS

Identical parts are provided with the same reference numbers in the figures.

Figure 1:
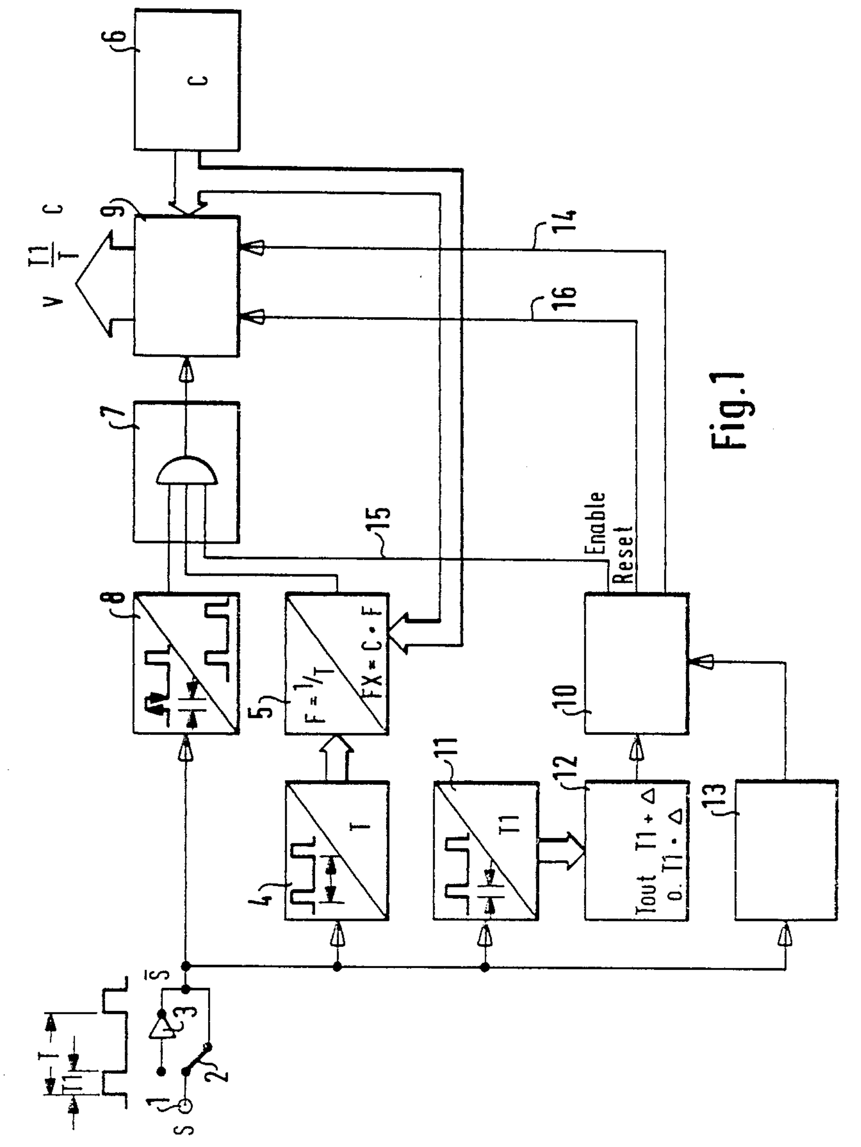
FIG. 1 is a circuit diagram of a first embodiment of the invention in which the period is measured by means of arithmetic operations.

Pulses whose duration ratio T1/T is to be measured are fed at 1 to the embodiment shown in FIG. 1. In order that the system can process pulses of both polarities, a changeover switch 2 and a negation stage 3 are provided at the input 1. For the derivation of clock pulses which correspond to a predetermined multiple of the frequency of the pulses fed at 1 (input pulses), the pulses are first of all fed to a circuit 4 for measuring the period T. This can be done, for instance, in the manner that during a period of the input pulses, pulses of higher repetition frequency are counted. The output signal of the circuit 4 is then fed to an arithmetic circuit 5 which, by forming the reciprocal, calculates the frequency of the pulses fed at 1 and multiplies the resultant value by a constant C. The constant C is fed by a corresponding storage 6 to the arithmetic circuit 5.

The arithmetic circuit 5 furthermore outputs a train of pulses whose frequency corresponds to a predetermined multiple of the frequency of the input pulses. The value of the multiple depends on the required resolution of the result of the measurement.

From the circuit 5 the pulses are fed to an input of a triple AND gate 7. The input pulses prepared in a pulse former 8 are fed to another input of the triple AND gate 7.

For the further explanations let us first of all assume that the third input of the triple AND gate 7 is acted on by a 1. The triple AND gate 7 accordingly causes the clock pulses preestablished by the circuit 5 to be fed to the n-bit counter 9 only during the occurrence of the input pulses. The count of the counter reached after a pulse corresponds thus to the duration ratio as a result of the coupling of the frequencies of the clock pulses with the input pulses. The count V can then be obtained from the output of the n-bit counter 9. At the start of each input pulse the n-bit counter 9 is set at zero. For this purpose, a corresponding signal is fed to the n-bit counter by a control block 10.

In the embodiment shown in FIG. 1, the control block however, has also other tasks which will be explained below. In particular, in the case of electronically controlled fuel-injection systems it may happen that the input pulses fed at 1 either become so wide that they become a continuous voltage (duration ratio 100%) or that the injection is entirely turned off, so that the duration ratio becomes zero. In this case, no determination of the frequency of the input pulses is possible any longer with the circuits 4 and 5, so that no corresponding clock pulses can be derived either.

The circuits 11 and 12, together with the aforementioned control block 10 and a level detector 13, serve to detect these operating conditions. In this connection, the determination of these operating conditions is effected in the form of so-called time-out monitoring in dynamic fashion. In the preferred use of the invention, it can namely be assumed that the frequency and the width of the input pulses change only relatively slowly in view of the inertia of the internal-combustion engine, while a change in the pulse width takes place suddenly upon reaching a duration ratio of 100%. For this purpose, the pulse width is first of all measured in a circuit 11. Within the circuit 12 there is formed therefrom a limit value which is the highest to be expected for the following pulse. This can be done by addition or multiplication. The width of the following pulse is compared with this value.

If the width of the following pulse is greater, it can be concluded from this that a pulse width of 100% is present. Over the line 14 the control block 10 frees an input register of the n-bit counter 9 which is intended for the constant C, as a result of which the counter assumes the value of the constant C. At the same time, the third input of the triple AND gate 7 is set to the value 0 via the line 15 from the control block 10, so that the counter remains at the value C.

While the duration ratio of the input pulses remains at 100%, the input signal is constantly compared with the limit value which was ascertained from the last individual pulse before the change to the duration ratio of 100%. In this way it is made possible for a termination of the 100% duration ratio to be recognized and the following individual pulse can again be tested in the manner described.

In order to obtain a correct result even in the event that the pulse width T1 approaches 0, such an event is detected in the level detector 13. The output of the level detector 13 is connected to an input of the control block, from which the n-bit counter 9 is set to 0 upon the absence of pulses over a line 16 and further counting is prevented over the line 15 and the triple AND gate 7. With the level detector 13 the additional result is obtained that upon the connecting of the system the required starting conditions can be created.

Figure 2:
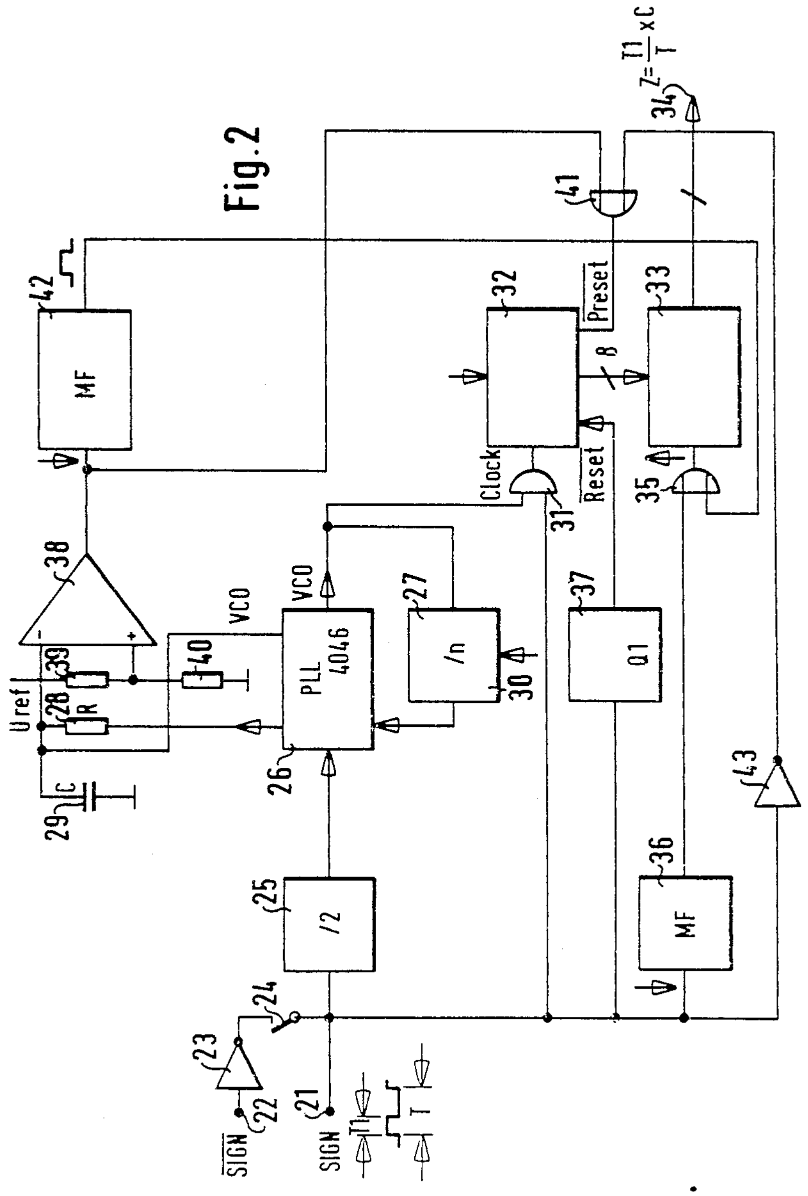
FIG. 2 is a circuit diagram of a second embodiment having a PLL circuit, in which the control voltage of the PLL circuit is used for determining whether input pulses are present.

With the system shown in FIG. 2, pulses of different polarity can again be processed, for which purpose one input 21 is connected directly, and another input 22 via an inverting amplifier 23 and a switch 24. Pulses of half frequency and a duration ratio of 50% are produced from the input pulses by a frequency divider 25. The said half-frequency pulses are fed to a PLL circuit 26. The PLL circuit 26 comprises essentially a controllable oscillator (VCO) and a frequency and phase comparison circuit.

The output voltage of the controllable oscillator is fed via a frequency divider 27 to an input of the frequency and phase comparison circuit and compared there with the pulses fed by the frequency divider 25. A voltage which represents the result of the comparison is fed via an RC circuit 28, 29 to the control input of the controllable oscillator. The described control of the controllable oscillator has the result that the frequency of the oscillator assumes a value which is greater by the division ratio n of the circuit 27 than the frequency of the pulses which are fed to the PLL circuit 26. The ratio n can be entered at 30 depending on the requirements of the individual case.

The clock pulses are fed to the counter 32 via the AND circuit 31. The input pulses are fed to another input of the AND circuit so that only those clock pulses which occur within a single pulse arrive at the counter. The count of the counter 32 thus provides a measure of the duration ratio. The count is written in a D-register 33 which, in the embodiment shown, is connected to the counter 32 via 8 lines for one bit each.

The D-register 33 is clocked by the input pulses via an OR circuit 35 and a monostable multivibrator 36. In this way the result is obtained that after the countering of the clock pulses the count is taken over into the D-register. As a result of the delay circuit 37, a delayed reset pulse is produced which, after the data transmission from the counter 32 to the D-register 33, resets the counter to 0.

In the absence of input pulses or in the case of pulse widths of 100%, the frequency of the signals which are fed to the PLL circuit 26 reaches the value 0. This can be noted by monitoring the output voltage of the frequency and phase comparison circuit of the PLL circuit 26 by means of a comparator 38. For this purpose, the one input of the comparator is acted on by the control voltage of the controllable oscillator while a comparison voltage is fed to the other input via a voltage divider of resistors 39, 40.

If the frequency approaches 0, then the output voltage of the comparator 38 assumes the logical value 0, which is fed to an input of the OR gate 41. If the duration ratio is 100%, then an 0 is present at the other input of the OR gate 41 over the inverter 43. The 0 which is thus present at the output of the OR gate 41 causes, via the inverting preset input of the counter, a setting of the counter to that value which corresponds to a duration ratio of 100%.

The output voltage of the comparator 38 is furthermore fed to a monostable multivibrator 42 the output signal of which is fed via the OR gate 35 to the clock input of the D-register 33. The rear flank of the output signal of the monostable multivibrator 42 causes the count (100%) to be taken over into the D-register 33.

If the duration ratio is 0%, then a 1 is fed to the lower input of the OR gate 41 by the inverter 43. Thus a 1 is also present at the output of the OR gate 41, with the result that the counter is not set to the previously set value but retains the value 0 previously obtained by "reset". This value is then taken over into the D-register 33 by the rear flank of the output signal of the monostable multivibrator 42.

The output of the D-register 33 forms the output 34 of the system, from which the measurement result Z can be taken.

Figure 3:
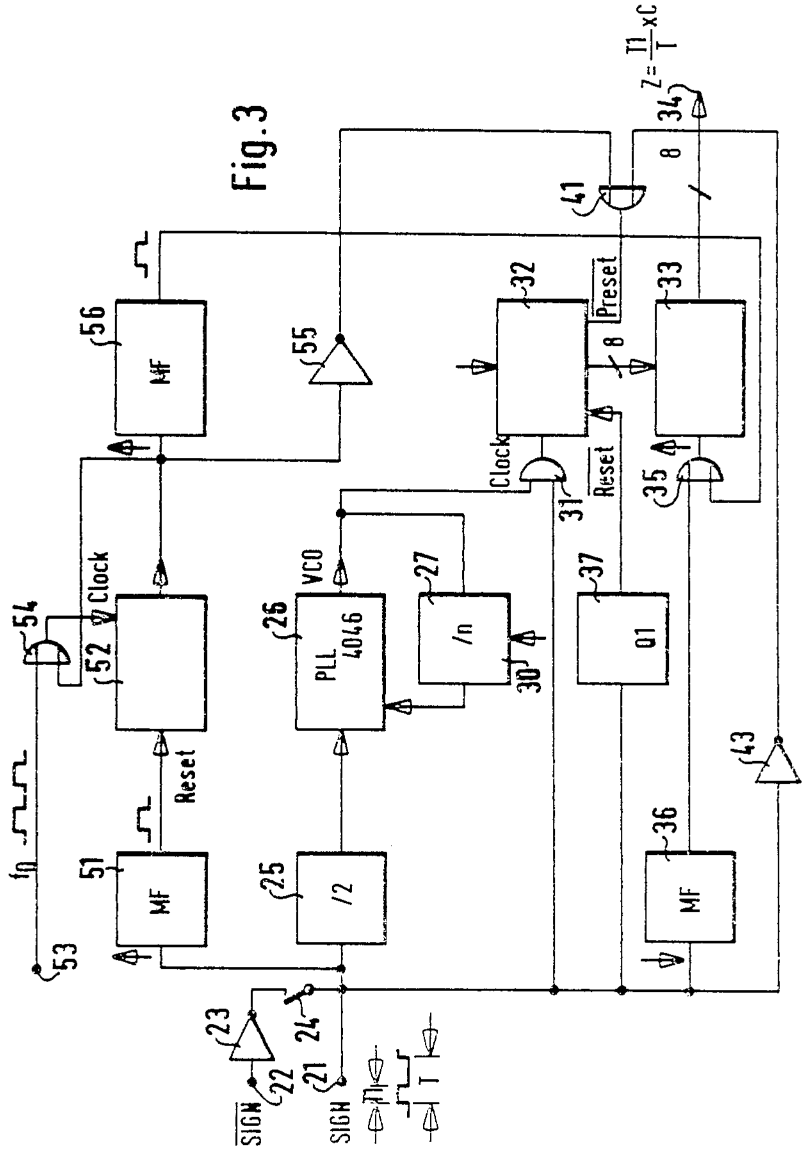
FIG. 3 is a diagram of a third embodiment, also with a PLL circuit, in which, however, a duration ratio of 100% is recognized by means of a counter.

In the system shown in FIG. 3, the derivation of a clock signal whose frequency corresponds to a multiple of the frequency of the input pulses, the pulse counting, the transfer of the count into a D-register, and the control of the counter and of the D-register take place in the same manner as in the system of FIG. 2. The determination as to whether a duration ratio of 100% is present takes place, however, in a different manner in the system of FIG. 3. For this purpose, a pulse of constant width is produced by means of a monostable multivibrator 51, and a counter 52 is reset by said pulse. A signal is fed as clock to the counter 52 ia an input 53 provided for this purpose and an OR gate 54. The carry output of the counter 52 is connected to another input of the OR gate 54, so that in the case of a carry no further counting pulses pass to the counter 52. The carry signal of the counter 52 is furthermore fed via an inverter 55 to an input of the OR gate 41. Finally, a monostable multivibrator 56 whose output is connected to an input of the OR gate 35 is connected to the carry output of the counter 52.

The counter 52 is set to 0 at the beginning of each period T of the input signal fed at 21 and it then counts the clock pulses fed at 53 whose frequency is considerably higher than that of the input pulses. Now the capacity of the counter 52 is so selected that no carry takes place within a period T of the input pulses. As long as the pulse width T1 has not reached 100%., the counter 52 is set to 0 at the beginning of each period T. If, however, a duration ratio of 100% is reached, then the resetting is done away with and, after a predetermined number of pulses of the clock signal fed at 53, a "1" is present at the carry output of the counter 52. By the returning of the carry output of the counter 52 via the OR gate 54, the counter is stopped so that the carry remains at the output until the reset pulse again comes from the input 21 via the monostable multivibrator 51.

The further processing of the information that a duration ratio of 100% is present takes place in the same manner as in the system of FIG. 2 so that further description of the course of the signal after the monostable multivibrator 56 and the inverter 55 is unnecessary.

Figure 4:
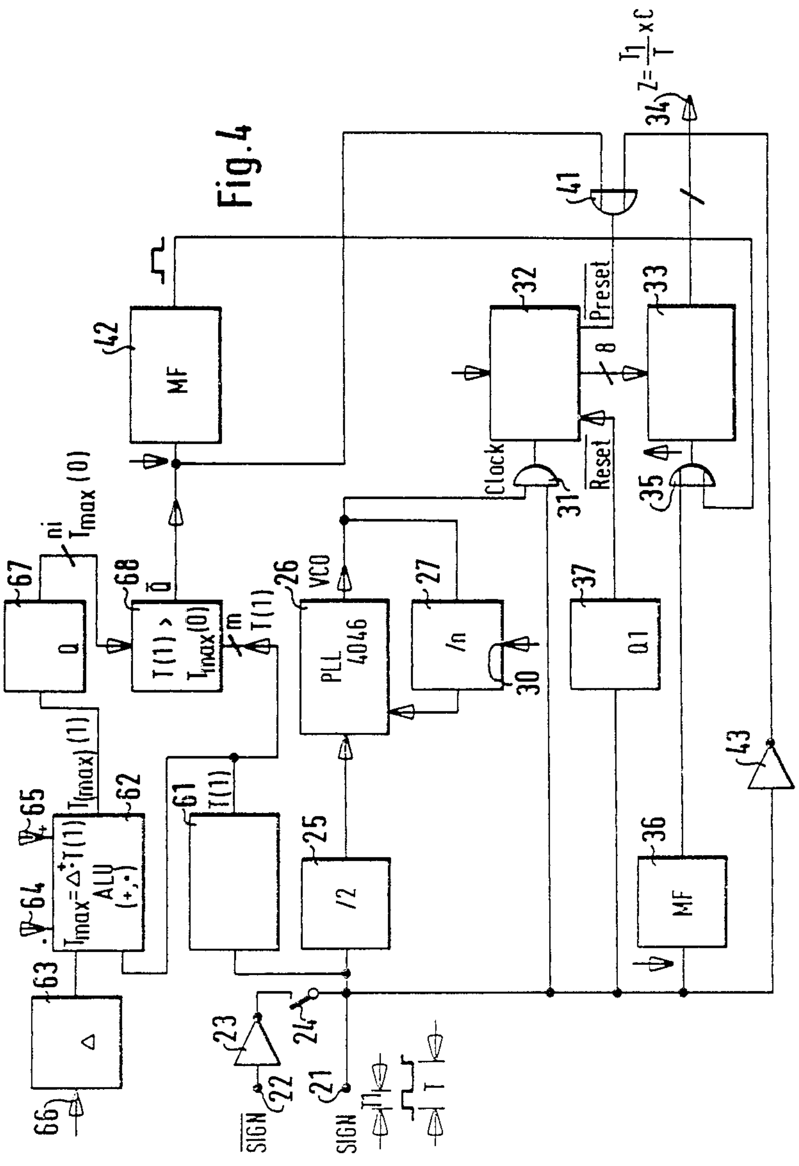
FIG. 4 is a circuit diagram of a fourth embodiment in which an adaptive determination of the duration ratio of 100% is effected.

While in the system according to FIG. 3 a constant pulse width is assumed for the determination as to whether the duration ratio is 100%, in the case of the system shown in FIG. 4 an adaptive determination is provided. In particular, upon the use of the system of the invention in connection with electronic fuel injection, it can be assumed that neither the frequency (corresponding to the engine speed of rotation) or the pulse width (duration of the individual injection) changes suddenly. Should a sudden change nevertheless take place in the pulse width, this permits the conclusion that there is a transfer to a duration ratio of 100%.

For the carrying out of this adaptive or sliding determination, the input pulses in the system of FIG. 4 are fed to a circuit 61 for the measurement of the period. This can be done in known manner by the counting of pulses during a period, the frequency of the counting pulses being substantially greater than the frequency of the input pulses.

The measured period T is multiplied in an arithmetic logic unit 62 by a constant stored at 63 or said constant is added to the period. Corresponding signals can be fed to the inputs 64 and 65 for selection between multiplication and addition. A constant adapted to the specific case of use can be fed via the input 66.

At the output of the arithmetic logic unit there is then present a value Tmax which corresponds to that period which is the maximum to be expected without a duration ratio of 100% being reached. This value is delayed at 67 by a period T and is compared in a comparator 68 with the duration of the following period. If the duration of the period T(1) is greater than the maximum duration determined from the preceding period Tmax(0), then a 0 is fed by the comparison circuit 68 to the monostable multivibrator 42 and the OR gate 41, which bridges about the functions which have already been described in connection with FIG. 2.

We claim:

1. A system for measuring the duration ratio of input pulses in a pulse train of variable pulse repetition frequency, particularly in electronically controlled fuel-injection systems for internal combustion engines, comprising means for generating clock pulses at a variable frequency which is a predetermined multiple of the pulse repetition frequency of the input pulses; and means responsive to the clock pulses for determining the duration ratio, said ratio determining means including means for counting the clock pulse during each input pulse.

2. The system according to claim 1, wherein said generating means comprises means for measuring the period of the input pulse train;

means for forming the reciprocal of the period; and means for multiplying the reciprocal by a predetermined constant to produce a product, said generating means outputting pulses at a repetition frequency proportional to said product.

3. The system according to claim 1, wherein said generating means comprises a controllable oscillator, a frequency and phase comparison circuit controlling an output frequency of said oscillator, and a frequency divider coupling an output signal of the oscillator to the comparison circuit.

4. The system according to claim 1, wherein said ratio determining means includes an AND gate for coupling the clock pulses to said counting means, the clock pulses being fed to a first input of the AND gate and the input pulses being fed to a second input of the AND gate.

5. The system according to claim 4, wherein said ratio determining means includes a delay unit coupling input pulses to the counting means; and wherein the counter is resetable with pulses of the delay unit which are delayed from the input pulses.

6. The system according to claim 5, wherein said ratio determining means comprises an OR gate, the counting means being setable to a predetermined value by preset signals generated by said generating means and fed via said OR gate to said counting means.

7. The system according to claim 4, further comprising a register and an OR gate, the register being connected to an output of the counter, the register being clocked with pulses provided by said generating means in response to the input pulses and fed to the register via said OR gate.

8. The system according to claim 5, wherein said ratio determining means comprises a first OR gate, the counting means being setable to a predetermined value by preset signals generated by said generating means and fed via said OR gate to said counting means; said system further comprising a monostable multivibrator, a register and a second OR gate, the register being connected to an output of the counter, the register being clocked with pulses provided by said generating means in response to the input pulses and fed to the register via said second OR gate; and wherein said ratio determining means further comprise means responsive to the input pulses and to the clock pulses for determining whether a duration ratio of 100% is present and for delivering a preestablished value of duration ratio in the case of a duration ratio of 100%; and wherein said means for determining whether a duration ratio of 100% is present is connected to an input of said first OR gate and, via said monostable multivibrator, to an input of said second OR gate.

9. The system according to claim 1, wherein said ratio determining means further comprises means responsive to the input pulses and to the clock pulses for determining whether a duration ratio of 100% is present and for delivering a preestablished value of duration ratio in the case of a duration ratio of 100%.

10. The system according to claim 9, wherein said generating means comprises a controllable oscillator, a frequency and phase comparison circuit controlling an output frequency of said oscillator, and a frequency divider coupling an output signal of the oscillator to the comparison circuit; and wherein said means for determining whether a duration ratio of 100% is present comprises a comparator which compares the output voltage of said frequency and phase comparison circuit to a reference voltage.

11. The system according to claim 9, further comprising an OR gate; and wherein the means for determining whether a duration ratio of 100% is present comprises a second counter for counting pulses of the input pulse train, said further counter having a carry output which can be reset by the input pulses, wherein the clock input of the second counter is connected to an output of the OR gate, one input of the OR gate is acted on by counter pulses, and the other input of the OR gate is connected to a carry of the second counter.

12. The system according to claim 9, wherein the pulse width is determined independently of the pulse frequency, said ratio means including an arithmetic unit providing a limit value, and when said limit value is exceeded, a duration ratio of 100% is assumed.

13. The system according to claim 12, wherein in the operation of the ratio determining means, the limit value is derived from the pulse width of a preceding pulse.

14. The system according to claim 13, wherein the derivation is effected by an addition/subtraction of said arithmetic unit to provide a preestablished value.

15. The system according to claim 13, wherein said arithmetic unit provides a multiplication function for multiplication of an interpulse interval of the input pulse train by a preestablished value.

* * * * *